United States Patent
Yeo et al.

(10) Patent No.: US 8,751,906 B2
(45) Date of Patent: Jun. 10, 2014

(54) SYSTEMS AND METHODS FOR OPERATING ON A STORAGE DEVICE USING A LIFE-CYCLE DEPENDENT CODING SCHEME

(75) Inventors: Engling Yeo, San Jose, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 212 days.

(21) Appl. No.: 13/474,095

(22) Filed: May 17, 2012

(65) Prior Publication Data

US 2012/0317459 A1    Dec. 13, 2012

Related U.S. Application Data

(60) Provisional application No. 61/496,253, filed on Jun. 13, 2011.

(51) Int. Cl.
| | |
|---|---|
| *H03M 13/00* | (2006.01) |
| *H03M 13/03* | (2006.01) |
| *G11C 29/00* | (2006.01) |
| *H04L 1/00* | (2006.01) |
| *H03M 13/35* | (2006.01) |
| *H03M 13/37* | (2006.01) |
| *H03M 13/05* | (2006.01) |
| *H03M 13/11* | (2006.01) |
| *H03M 13/15* | (2006.01) |

(52) U.S. Cl.
CPC .......... *H03M 13/35* (2013.01); *H03M 13/3715* (2013.01); *H03M 13/05* (2013.01); *H03M 13/1154* (2013.01); *H03M 13/1162* (2013.01); *H03M 13/1515* (2013.01); *H03M 13/152* (2013.01); *H04L 1/0009* (2013.01); *H04L 1/0059* (2013.01); *H04L 1/0061* (2013.01)
USPC .......... 714/774; 714/782; 714/784; 714/786; 714/752; 714/763; 714/768; 714/769; 714/773; 714/799

(58) Field of Classification Search
CPC ............ H03M 13/05; H03M 13/1154; H03M 13/1162; H03M 13/1515; H03M 13/152; H03M 13/35; H03M 13/3715; H04L 1/0009; H04L 1/0059; H04L 1/0061
USPC ......... 714/774, 782, 784, 786, 752, 763, 768, 714/769, 773, 799
See application file for complete search history.

(56) References Cited

U.S. PATENT DOCUMENTS

| | | | | |
|---|---|---|---|---|
| 6,987,778 | B2 * | 1/2006 | Sindhushayana et al. | 370/468 |
| 7,451,381 | B2 * | 11/2008 | Miller et al. | 714/774 |
| 7,827,346 | B2 * | 11/2010 | Anderson | 711/103 |
| 8,086,940 | B2 * | 12/2011 | Yousef | 714/778 |
| 8,131,916 | B2 * | 3/2012 | Anderson | 711/103 |
| 8,281,217 | B2 * | 10/2012 | Kim et al. | 714/763 |
| 8,327,226 | B2 * | 12/2012 | Rub | 714/763 |
| 8,423,864 | B2 * | 4/2013 | Yokokawa et al. | 714/763 |
| 8,443,255 | B2 * | 5/2013 | Jiang et al. | 714/758 |
| 8,448,049 | B2 * | 5/2013 | Sakai et al. | 714/781 |
| 8,499,217 | B2 * | 7/2013 | Song et al. | 714/758 |
| 8,631,299 | B2 * | 1/2014 | Sugihara et al. | 714/751 |
| 2003/0005385 | A1 * | 1/2003 | Stieger | 714/758 |

(Continued)

*Primary Examiner* — John J Tabone, Jr.

(57) ABSTRACT

Systems and methods for adaptively operating a storage device are provided. A level of integrity of storing data in the storage device is determined. A coding scheme is selected based on the determined level of integrity of the storage device. An operation is performed on the storage device using the selected coding scheme.

18 Claims, 4 Drawing Sheets

(56) References Cited

U.S. PATENT DOCUMENTS

| | | | |
|---|---|---|---|
| 2006/0045214 A1* | 3/2006 | Shiina | 375/341 |
| 2006/0080581 A1* | 4/2006 | Ono | 714/704 |
| 2012/0026939 A1* | 2/2012 | Sindhushayana et al. | 370/328 |
| 2012/0131268 A1* | 5/2012 | Anderson | 711/103 |
| 2013/0086454 A1* | 4/2013 | Rub | 714/773 |
| 2013/0145229 A1* | 6/2013 | Frayer et al. | 714/755 |
| 2013/0145231 A1* | 6/2013 | Frayer et al. | 714/763 |
| 2014/0040707 A1* | 2/2014 | Shinohara et al. | 714/776 |

* cited by examiner

Coding Map

300

| Block/Page/Storage Location(s) | Encoder Used |
|---|---|
| 0-100 | First Coding Scheme Only, not Second Coding Scheme |
| 101-110 | Second Coding Scheme Only, not First Coding Scheme |
| 111-150 | First and Second Coding Schemes (Concatenated Codes) |
| 151-200 | First Coding Scheme Only, not Second Coding Scheme |
| 201 \| End of Memory | First and Second Coding Schemes |

SYSTEMS AND METHODS FOR OPERATING ON A STORAGE DEVICE USING A LIFE-CYCLE DEPENDENT CODING SCHEME

CROSS REFERENCE TO RELATED APPLICATION

This disclosure claims the benefit of U.S. Provisional Application No. 61/496,253, filed Jun. 13, 2011, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, is neither expressly nor impliedly admitted as prior art against the present disclosure.

Data error rates in traditional flash memory devices depend on the life-cycle of the memory. Specifically, the data integrity of the memory depends on a duration of time the data is retained in the memory as well as the number of program-erase (PE) cycles of the block, page or location where the data resides and many other factors. Traditional systems use error correction code circuitries (ECC) and encoding/decoding engines to detect/correct data errors encountered when writing/reading the data to/from the flash memory devices. Traditional systems may also remap blocks or storage locations to spread write operations across the device or mark blocks as bad to avoid future write operations to those blocks. Although these systems successfully address the flash memory data storage integrity, these methods oftentimes waste resources decoding and encoding data by using complex coding schemes when less complex coding schemes would suffice and therefore lack efficiency (i.e., wastes resources, consumes a large amount of power and increases decoding latency by taking more time to decode).

SUMMARY

Systems and methods for adaptively operating an electronic storage device are provided. A level of integrity of storing data in the storage device is determined. A coding scheme is selected based on the determined life-cycle of the storage device. An operation is performed on the storage device using the selected coding scheme.

In some implementations, the level of integrity indicates a number of program-erase cycles associated with the storage device. In some implementations, the level of integrity indicates a number of errors resulting from operating on the storage device. In some implementations, the life-cycle indicates a value determined based on a number of errors resulting from an initial operation on the storage device.

In some embodiments, the coding scheme is selected by identifying a first coding scheme having a first complexity and a second coding scheme having a second complexity. A determination is made as to whether the level of integrity exceeds a threshold. In response to determining the level of integrity exceeds the threshold, the first coding scheme and the second coding scheme are selected as the selected coding scheme. Otherwise, the first coding scheme is selected but not the second coding scheme as the selected coding scheme. In some implementations, the second complexity is greater than the first complexity. In some implementations, the first coding scheme is a BCH coding scheme and the second coding scheme is a LDPC coding scheme.

In some embodiments, operating the storage device includes encoding data using the selected coding scheme. The encoded data is written to the storage device. In some embodiments, operating on the storage device includes reading data from the storage device. The read data is decoded using the selected coding scheme.

In some embodiments, a storage location of the encoded data is cross-referenced with a coding scheme associated with the storage location to select the decoding scheme. In some implementations, the storage device is a solid-state storage device. In some implementations, the coding scheme selected for encoding the data includes a combination of a plurality of coding schemes and the coding scheme selected for decoding the data includes a subset of the plurality of coding schemes. In some implementations, the subset of the plurality of coding schemes includes a systematic coding scheme.

BRIEF DESCRIPTION OF THE DRAWINGS

The above and other objects and advantages of the present disclosure will be apparent upon consideration of the following detailed description, taken in conjunction with the accompanying drawings, in which like reference characters refer to like parts throughout, and in which.

DETAILED DESCRIPTION

This disclosure generally relates to operating (reading/writing) on a storage device using a life-cycle dependent coding scheme. For illustrative purposes, this disclosure is described in the context of an electronic storage system where the storage used is a solid-state memory device (e.g., a flash memory device). However, it should be understood that the teachings of this disclosure are equally applicable to any other electronic storage system where the data that is written to the storage system is prone to reading errors based on a life-cycle of the storage system (e.g., random access memory devices, programmable logic devices, non-volatile memory, volatile memory, FeRAM, CBRAM, PRAM, SONOS, RRAM, Racetrack memory, NRAM and Millipede storage devices).

Figure 1:
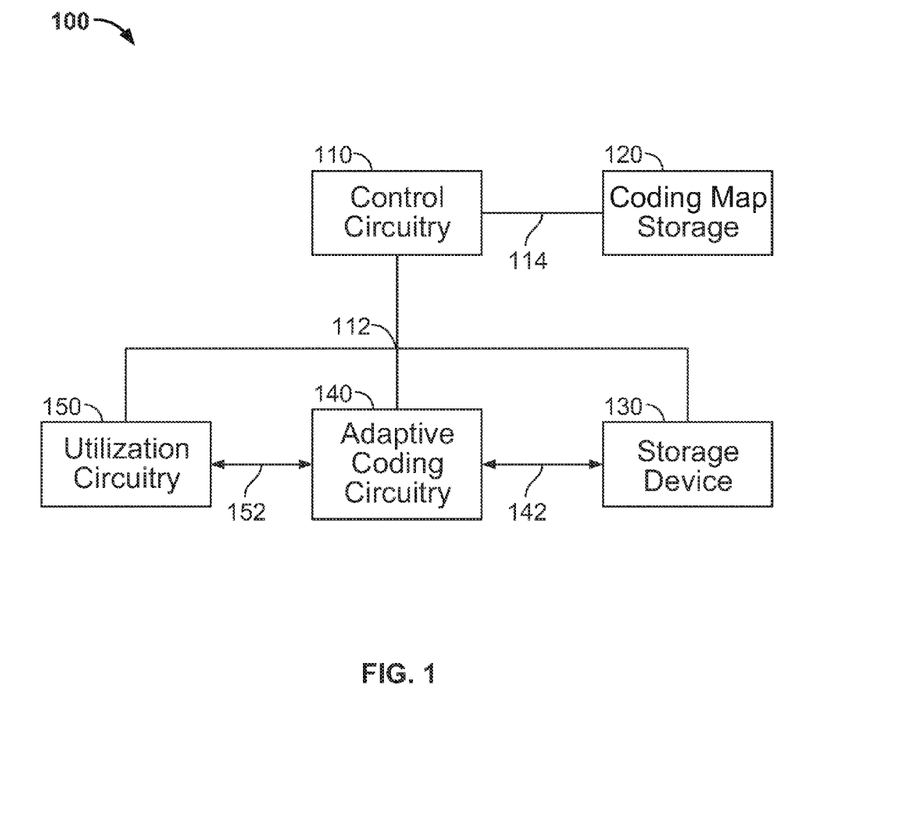
FIG. 1 shows an illustrative system that operates on a storage device using a life-cycle dependent coding scheme in accordance with some embodiments of the present disclosure.

FIG. 1 shows an illustrative system 100 that operates on a storage device using a life-cycle dependent coding scheme in accordance with some embodiments of the present disclosure. System 100 includes control circuitry 110, coding map storage circuitry 120, a storage device 130, adaptive coding circuitry 140 and utilization circuitry 150.

Storage device 130 may include an electronic storage device (e.g., flash memory device, random access memory devices, programmable logic devices, non-volatile memory, volatile memory, FeRAM, CBRAM, PRAM, SONOS, RRAM, Racetrack memory, and/or NRAM and Millipede storage devices).

Utilization circuitry 150 may include various analog or digital processing circuitries. For example, utilization may be a digital signal processor or a microprocessor or central processing unit (CPU). In some implementations, utilization circuitry 150 may include transmitter/receiver circuitry. In some embodiments, utilization circuitry 150 may provide control signals to any one of the components of system 100 to execute, change or modify the encoding/decoding, storing and retrieving memory operations. Utilization circuitry 150 may provide or receive user or system data to/from any one of the components of system 100 to store/read from storage device 130.

In some embodiments, control circuitry 110 may receive instructions from utilization circuitry 150 to operate on (e.g., read/write data from/to) storage device 130. Control circuitry 110 may instruct storage device 130 to store or output data to/from an address location supplied by utilization circuitry 150. For example, control circuitry 110 may instruct storage device 130 to retrieve a block or page of data.

In some embodiments, control circuitry 110 may determine a life-cycle of storage device 130 in response to receiving an instruction from utilization circuitry 150 to store data 152 to storage device 130. The computed life-cycle of storage device 130 may represent the integrity with which data can be stored in a particular section of storage device 130. For example, a low value for the life-cycle may indicate a high level of integrity for the storage device while a high value for the life-cycle may indicate a lower level of integrity. In some implementations, as the level of integrity increases the coding scheme complexity decreases. Specifically, control circuitry 110 may control adaptive coding circuitry 140 to encode data 152 with a more complex encoder when the level of integrity is low. However, control circuitry 110 may control adaptive coding circuitry 140 to encode data 152 with a less complex encoder when the level of integrity is high. Similarly, control circuitry 110 may determine the decoding complexity used to encode data stored in a particular section of storage device 130 using information stored in coding map storage 120 and may instruct adaptive coding circuitry 140 to decode read data based on the complexity used to encode the data.

In some implementations, control circuitry 110 may compute the life-cycle on a block, page, storage location, or sector level of storage device 130. Specifically, the life-cycle may be different for each storage location (s) of storage device 130. Accordingly, control circuitry 110 may modify the encoding complexity used to encode data on a segment-by-segment (e.g., page-by-page) basis. For example, one storage location of storage device 130 corresponding to a first page of data may store data encoded with a first encoding scheme while a second page of storage device 130 corresponding to a second page of data may store data encoded with a different second encoding scheme.

In some implementations, control circuitry 110 may compute the life-cycle for a given section of storage device 130 by measuring how many erasures (or PE cycles) have been performed in the given storage location(s) of storage device 130 for which the requested operation (read/write) is to be performed. In some implementations, control circuitry 110 may compute the life-cycle by measuring a length of time data has been stored in or the age of a given storage location(s) of storage device 130 for which the requested operation (read/write) is to be performed. Control circuitry 110 may determine the life-cycle by reading a dedicated storage location from storage device 130 that maintains the life-cycle for one or more storage locations of storage device 130. In some implementations, control circuitry 110 may instruct storage device 130 to compute its own life-cycle and output the computed life-cycle back to control circuitry 110.

In some implementations, control circuitry 110 may determine the life-cycle and control the coding scheme selection based on initial decisions resulting from previous operating on storage device 130. For example, an LDPC decoder may be used to compute the life-cycle based on initial decisions on data read from storage device 130. Specifically, the LDPC decoder may read from storage device 130 data and perform a decoding operation on the read data. Control circuitry 110 may analyze the output of LDPC decoder to determine whether any errors are present or detected. In response to detecting a number of errors greater than a threshold, control circuitry 110 may assign as the life-cycle value for the corresponding storage location of storage device 130 a number that causes a more complex coding scheme to be selected. Similarly, if a life-cycle value is already assigned for the corresponding storage location, control circuitry 110 may increase the value of the life-cycle. In response to detecting a number of errors less than a threshold or zero, control circuitry 110 may maintain the life-cycle value unchanged or assign as the life-cycle value for the corresponding storage location of storage device 130 a number that causes a less complex coding scheme to be selected.

Control circuitry 110 may use the computed life-cycle to determine which type of coding scheme to apply (e.g., the level of complexity used to encode data) to operate on (store/read to/from) storage device 130. Control circuitry 110 may assign a value to the life-cycle based on the number of erasures, length of time data has been stored, age of the storage device, and/or other suitable criteria. For example, control circuitry 110 may assign a value to the computed life-cycle that is proportional or inversely proportional to the PE cycles and/or age of the storage location(s).

In some embodiments, control circuitry 110 may determine a level of coding scheme (e.g., the level of complexity used to encode data) for storing the data based on the assigned value of the life-cycle. In some implementations, control circuitry 110 may compare the assigned life-cycle value to one or more threshold values. The number of threshold values used to compare the life-cycle may correspond to the number of available encoding schemes (e.g., number of available encoders or combination of encoders) in adaptive coding circuitry 140. For example, when adaptive coding circuitry 140 includes two encoder circuits, the number of threshold values may be two. In particular, the number of threshold values may be equal to N–1, where N is the number of available encoder circuits in adaptive coding circuitry 140.

Figure 2:
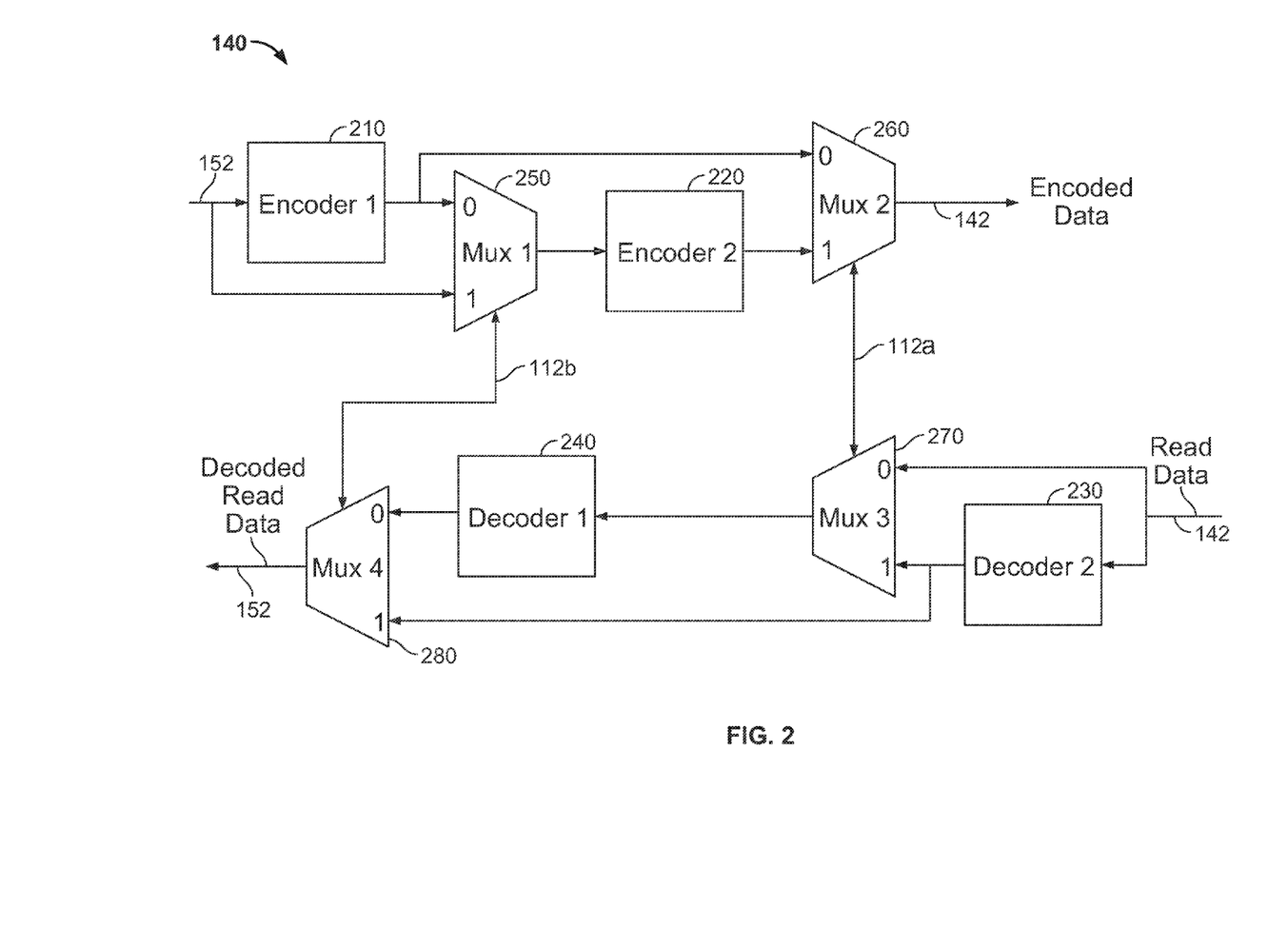
FIG. 2 shows an illustrative life-cycle dependent coding in circuitry in accordance with some embodiments of the present disclosure.

In some embodiments, when two threshold values are used and when adaptive coding circuitry 140 includes two encoders 210 and 220, control circuitry 110 may compare the value assigned to the life-cycle with a first of the two threshold values which corresponds to the lower threshold value. When the value assigned to the life-cycle is lower than the first threshold value, control circuitry 110 may generate a selection signal 112 that corresponds to the selection and use of the least complex encoding scheme (e.g., use of first encoder circuit 210). When the value assigned to the life-cycle is higher than the first threshold value, control circuitry 110 may compare the value assigned to the life-cycle to the second threshold value. When the value assigned to the life-cycle is higher than the first threshold value but lower than the second threshold value, control circuitry 110 may generate a selection signal 112 that corresponds to the selection and use of a higher complex encoding scheme (e.g., use of second encoder circuit 220). When the value assigned to the life-cycle is higher than the first threshold value and higher than the second threshold value, control circuitry 110 may generate a selection signal 112 that corresponds to the selection and use of a highest complexity encoding scheme (e.g., use of a concatenation of first encoder circuit 210 and second encoder circuit 220).

In some embodiments, the threshold values may be set based on the desired power consumption and latency of a given application and/or level of reliability and integrity needed for storing data. Specifically, the threshold values may indicate what level of encoding complexity is needed to ensure high data integrity for storing data in a section of memory having a given assigned life-cycle (e.g., a certain number of PE cycles). In particular, the lower the value that is set for the first lower threshold value, the more likely that more complex encoding scheme is used for a computed life-cycle.

For example, a first threshold value for a section of storage device 130 may be set to a life-cycle of 10,000 erase cycles or 15% errors/page. In such circumstances, data to be stored in that section of storage device 130 may be encoded with a first encoding scheme as long as the life-cycle for that section of storage device 130 is less than the first threshold value. A second threshold value for the section of storage device 130 may be set to a life-cycle of 20,000 erase cycles or 40% errors/page. In such circumstances, data to be stored in that section of storage device 130 may be encoded with a second encoding scheme when the life-cycle for that section of storage device 130 is greater than the first threshold value but less than the second threshold value.

In some implementations, after or in response to control circuitry 110 determining the coding scheme used to encode data based on the life-cycle of the section of storage device 130, control circuitry 110 may store an indication of the determined coding scheme in coding map storage 120. In particular, coding map storage 120 may include a table that maps a segment of storage device 130 to a type or level of coding complexity used to encode data in that segment. For example, control circuitry 110 may determine that blocks 0-100 of storage device 130 have a low life-cycle value and accordingly only a first coding scheme is needed to encode data for storage in blocks 0-100. In such circumstances, control circuitry 110 may update the table in coding map storage 120 to indicate that data stored in blocks 0-100 of storage device 130, has been encoded using only a first coding scheme and not a second coding scheme. Similarly, control circuitry 110 may determine that blocks 201-end of storage of storage device 130 have a high life-cycle value and accordingly a concatenated coding scheme of a first coding scheme and a second coding scheme is needed to encode data for storage in those blocks. In such circumstances, control circuitry 110 may update the table in coding map storage 120 to indicate that data stored in blocks 201-end of storage of storage device 130, has been encoded using a concatenated coding scheme of a first coding scheme and a second coding scheme.

In some embodiments, control circuitry 110 may cross-reference a particular storage location from which reading data is requested with a coding scheme using coding map storage 120. Control circuitry 110 may perform the cross-referencing in response to control circuitry 110 receiving an instruction from utilization circuitry 150 to read data from the particular storage location (s) of storage device 130. For example, control circuitry 110 may receive an indication from utilization circuitry 150 to read data from blocks 120-130 of storage device 130. In response, control circuitry 110 may cross-reference the requested memory location (e.g., blocks 120-130) using coding map storage 120 to identify the corresponding coding scheme that was used. For example, control circuitry 110 may cross-reference blocks 120-130 using coding map storage 120 and determine that for these blocks, a concatenated coding scheme that combines the first and second coding schemes was used. Accordingly, control circuitry 110 may instruct adaptive coding circuitry 140 to decode data read from that memory section (e.g., blocks 120-130 of storage device 130) using a concatenated coding scheme that combines the first and second coding schemes (e.g., first decode using the second coding scheme and then decode the decoded data using the first decoding scheme). The decoded data may be provided to utilization circuitry 150

FIG. 2 shows an illustrative life-cycle dependent coding circuitry 140 in accordance with some embodiments of the present disclosure. Life-cycle dependent coding circuitry 140 may include a first selection circuit 250 (mux 1), a second selection circuit 260 (mux 2), a third selection circuit 270 (mux 3), a fourth selection circuit 280 (mux 4), encoder circuits 210 and 220 and decoder circuits 230 and 240. Although only two encoder circuits 210 and 220 and two decoder circuits 230 and 240 are shown and described in connection with FIG. 2, life-cycle dependent coding circuitry 140 may include any number of additional or less decoder circuits and selection circuits. Specifically, the present disclosure is described in the context of a two level concatenated coding scheme where data can be encoded/decoded by one or two coding schemes. However, it should be understood that the present disclosure applies to any level concatenated coding scheme where data can be encoded/decoded by any number of suitable coding schemes without departing from the scope of the disclosure.

Each encoder circuit 210 and 220 may be configured to encode data using a different encoding technique or scheme. In some implementations, first encoder circuit 210 may be configured to encode data using an encoding technique that is less powerful and less complex than second encoder circuit 220. For example, first encoder circuit 210 may be a BCH encoder and second encoder circuit 220 may be an LDPC encoder. In some implementations, first encoder circuit 210 may be a first convolutional code encoder and second encoder circuit 220 may be a second convolutional code encoder. In some implementations, first encoder circuit 210 may be a Reed Solomon encoder and second encoder circuit 220 may be a Turbo code encoder.

Each decoder circuit 230 and 240 may be configured to decode data using a different decoding technique or scheme. In some implementations, first decoder circuit 230 may be configured to decode data using a decoding technique that is more powerful and more complex than second decoder circuit 240. For example, first decoder circuit 230 may be a LDPC decoder and second encoder circuit 240 may be a BCH decoder. In some implementations, first decoder circuit 230 may be a first convolutional code decoder and second encoder circuit 240 may be a second convolutional code decoder. In some implementations, first decoder circuit 230 may be a Turbo code decoder and second decoder circuit 240 may be a Reed Solomon decoder.

Each selection circuit 250, 260, 270 and 280 may include a multiplexer or de-multiplexer circuit. Each selection circuit 250, 260, 270 and 280 may include a plurality of inputs (e.g., two inputs), a control input and an output. Each selection circuit 250, 260, 270 and 280 couples one of the inputs selected by the control input to the output. For example, first selection circuit 250 may include two inputs, where one of the two inputs is coupled to an output of encoder circuit 210 and the other of the two inputs is coupled to receive data signal 152 from utilization circuitry 150. First selection circuit 250 may receive as the control input a control signal 112b from control circuitry 110. The output of first selection circuit 250 may be coupled to an input of second encoder 220. In some implementations, first selection circuit 250 receives the same control signal 112b as fourth selection circuit 280.

In some embodiments, second selection circuit 260 may include two inputs, where one of the two inputs is coupled to an output of second encoder circuit 220 and the other of the two inputs is coupled to receive an output of first encoder circuit 210. Second selection circuit 260 may receive as the control input a control signal 112a from control circuitry 110. The output of second selection circuit 260 may be coupled to storage device 130 and provide encoded data as signal 142 to storage device 130. In some implementations, second selection circuit 260 receives the same control signal 112a as third selection circuit 270.

In some embodiments, third selection circuit 270 may include two inputs, where one of the two inputs is coupled to an output of first decoder circuit 230 and the other of the two inputs is coupled to receive encoded data signal 142 read from storage device 130. Third selection circuit 270 may receive as the control input control signal 112a from control circuitry 110. The output of third selection circuit 270 may be coupled to an input of second decoder circuit 240.

In some embodiments, fourth selection circuit 280 may include two inputs, where one of the two inputs is coupled to an output of second decoder circuit 240 and the other of the two inputs is coupled to receive an output of first decoder circuit 230. Fourth selection circuit 280 may receive as the control input a control signal 112b from control circuitry 110. The output of fourth selection circuit 280 may be coupled to utilization circuitry 150 and provide decoded data as signal 152 to utilization circuitry 150.

In some embodiments, during a store operation, control circuitry 110 may receive a store or write command from utilization circuitry 150. In response, control circuitry 110 may determine a life-cycle value of the storage location of storage device 130 in which the data provided by utilization circuitry 150 over signal 152 is to be written. Based on the determined life-cycle, control circuitry 110 may determine a level of encoding to perform on the data provided by utilization circuitry 150 prior to storing in the specified location. For example, control circuitry 110 may compare the assigned life-cycle value to one or more thresholds. In response to determining that the assigned life-cycle value exceeds a first threshold value, control circuitry 110 may determine that a first encoding scheme (e.g., concatenated encoding scheme, such as a combination of BCH with LDPC coding) is needed to encode the data. Similarly, in response to determining that the assigned life-cycle value does not exceed the first threshold value, control circuitry 110 may determine that a second encoding scheme is needed to encode the data, where the second encoding scheme (e.g., BCH coding) is less complex than the first encoding scheme.

Control circuitry 110 may generate control signals 112a and 112b which control selection circuits 250 and 260. For example, control circuitry 110 may determine that only a first encoding scheme is needed to write data reliably to storage device 130 based on the life-cycle value of the storage location. In response, control circuitry 110 may generate control signal 112a and provide control signal 112a to second selection circuit 260 that instructs second selection circuitry 260 to select the output of first encoder 210 as the output signal 142 to storage device 130.

In some implementations, control circuitry 110 may determine that only a second encoding scheme (implemented by second encoder 220 but not first encoder 210) is needed to write data reliably to storage device 130 based on the life-cycle of the storage location. In response, control circuitry 110 may generate control signals 112a and 112b and provide control signals 112a and 112b to first selection circuit 250 and second selection circuit 260. Control signal 112a may instruct first selection circuit 250 to select the input data signal 152 from utilization circuitry 150 as the output to second encoder 220. Control signal 112b may instruct second selection circuitry 260 to select the output of second encoder 220 as the output signal 142 to storage device 130.

In some embodiments, control circuitry 110 may determine that a concatenated coding scheme that combines a first encoding scheme with a second encoding scheme is needed to write data reliably to storage device 130 based on the life-cycle of the storage location. In response, control circuitry 110 may generate control signals 112a and 112b and provide control signals 112a and 112b to first selection circuit 250 and second selection circuit 260. Control signal 112a may instruct first selection circuit 250 to select the output from first encoder 210 as the output to second encoder 220. Control signal 112b may instruct second selection circuitry 260 to select the output of second encoder 220 as the output signal 142 to storage device 130. Accordingly, since in such circumstances second encoder 220 receives encoded data from first encoder 210, second encoder 220 encodes the already encoded data and provides that output to second selection circuit 260 for output to storage device 130.

In some embodiments, instead of or in addition to selecting the path data takes through encoders and decoders by changing the selection inputs of selection circuits 250, 260, 270 and 280, control circuitry 110 may enable/disable (power ON or power OFF) appropriate encoders/decoders to encode/decode data with a particular coding scheme. For example, data from utilization circuitry 150 may be coupled directly or indirectly to multiple encoder circuits, where each encoder circuit implements a different encoding scheme. Each of the encoder circuits may be coupled to a single selection circuit which outputs data to storage device 130. Control circuitry 110 may determine the need to encode data based on the assigned life-cycle value with a first encoding scheme implemented by a first of the encoder circuits. Accordingly, control circuitry 110 may transmit control signals 112 instructing the first encoder circuit to become enabled (e.g., power ON or exit sleep mode) and instruct the remaining encoders to remain in their initial disabled (powered OFF or sleep) state. Control circuitry 110 may control the selection circuit to select and output the data output by the first encoder. After the first encoder completes encoding the given data set, the first encoder may return to its initial disabled (powered OFF or sleep) state.

In some embodiments, data from storage device 130 may be coupled directly or indirectly to multiple decoder circuits, where each decoder circuit implements a different decoding scheme. Each of the decoder circuits may be coupled to a single selection circuit which outputs decoded data to utilization circuitry 150. Control circuitry 110 may determine the need to decode data based on the assigned life-cycle value (or a value or indication stored in coding map storage 120) with a first decoding scheme implemented by a first of: the decoder circuits. Accordingly, control circuitry 110 may transmit control signals 112 instructing the first decoder circuit to become enabled (e.g., power ON or exit sleep mode) and instruct the remaining decoders to remain in their initial disabled (powered OFF or sleep) state. Control circuitry 110 may control the selection circuit to select and output the decoded data output by the first decoder. After the first decoder completes decoding the given data set, the first decoder may return to its initial disabled (powered OFF or sleep) state.

In some embodiments, control circuitry 110 may store in coding map storage 120 the value or values of control signals 112a and 112b used for controlling selection circuits 250 and 260 to encode data for a particular storage location of storage device 130 with a selected coding scheme. In such circumstances, during a read operation, control circuitry 110 may cross-reference the storage location from which the read operation is requested to be performed with the control signal values stored in coding map storage 120. By retrieving the control signal values stored in coding map storage 120 for the storage location, control circuitry 110 may provide the same control signals back to adaptive coding circuitry 140 to control third and fourth selection circuits 270 and 280 and decode the read data in the corresponding (same or reverse) manner at which the read data was encoded. In some implementations, control circuitry 110 may retrieve the control signal values from coding map storage 120 and may re-compute the life-cycle associated with the particular storage location to determine what type of coding scheme is needed to decode the read data. Control circuitry 110 may generate the corresponding control signals 112a and 112b for provision to selection circuits 270 and 280.

In some implementations, control circuitry 110 may determine that the read data was encoded using first encoder 210 and second encoder 220. In such circumstances, one or both of first encoder 210 and second encoder 220 may use a systematic coding scheme. Control circuitry 110 may determine a life-cycle for the corresponding storage location and, based on the life-cycle, instruct selection circuits 270 and 280 to cause only first decoder circuit 230 or second decoder circuit 240 to be used to decode the read data. Specifically, even through two encoders or two coding schemes were used to encode data stored in a particular storage location, control circuitry 110 may decode that data using only one decoder or only one coding scheme so as to bypass one of the other decoders. The bypassed decoder may be instructed to output the user bits directly to the utilization circuitry or the other decoder.
Specifically, the parity bits corresponding to the second coding scheme may be stripped from the read data and provided to the first decoder to be combined with the first coding scheme when decoding using only one decoder the read data that was encoded using two encoders. Control circuitry 110 may generate the corresponding control signals 112a and 112b for provision to selection circuits 270 and 280 to perform the decoding in this manner In some embodiments, control circuitry 110 may generate control signals 112a and 112b or control what decoders are used to decode read data based on a decoding error history instead of a computed life-cycle. For example, control circuitry 110 may start operating on storage device 130 (e.g., decode data read from storage device 130) using only a first decoder circuitry or a first coding scheme. Control circuitry 110 may monitor the number of errors corrected by the decoder circuitry or using the coding scheme. In response to determining that the number of errors is greater than a threshold, control circuitry 110 may proceed to decoder or operate on storage device 130 using a second decoder circuitry (e.g., a decoder circuitry that is more complex than the first decoder circuitry) or a second coding scheme (e.g., a more complex coding scheme than the first coding scheme). Control circuitry 110 may generate the corresponding control signals 112a and 112b for provision to selection circuits 270 and 280 to perform the decoding in this manner.

In some embodiments, during a read operation, control circuitry 110 may receive a read command from utilization circuitry 150. In response, control circuitry 110 may retrieve the control signal values stored in coding map storage 120 associated with the storage location of storage device 130 from which the data provided by utilization circuitry 150 over signal 152 is to be read. In some implementations, control circuitry 110 may determine a life-cycle value for the storage location and compute the appropriate coding scheme to generate the appropriate control signals 112a and 112b. In some implementations, control circuitry 110 may determine the coding scheme used to encode data in the specified storage location based on information stored in coding map storage 120 and generate the appropriate control signals 112a and 112b to decode the read data from that location. Control circuitry 110 may generate control signals 112a and 112b which control selection circuits 270 and 280. For example, control circuitry 110 may determine that only a first decoding scheme (e.g., BCH decoding scheme implemented by second decoder 240) is needed to decode the read data from storage device 130. In response, control circuitry 110 may generate control signals 112a and 112b and provide control signals 112a and 112b to third and fourth selection circuits 270 and 280. In response, third selection circuitry 270 may select the read data signal 142 as the input to second decoder 240 and fourth selection circuitry 280 may select the output of second decoder 240 as signal 152 provided to utilization circuitry 150.

In some implementations, control circuitry 110 may determine that only a second decoding scheme (implemented by first decoder 230 but not second decoder 240) is needed to decode read data from storage device 130. In response, control circuitry 110 may generate control signal 112a and provide control signal 112b to fourth selection circuit 280. Control signal 112b may instruct fourth selection circuit 280 to select the output from first decoder 230 as the output to utilization circuitry 150.

In some embodiments, control circuitry 110 may determine that a concatenated decoding, scheme that combines a first decoding scheme with a second decoding scheme is needed to read data from storage device 130 based on the life-cycle value of the storage location. In response, control circuitry 110 may generate control signals 112a and 112b and provide control signals 112a and 112b to third selection circuit 270 and fourth selection circuit 280. Control signal 112a may instruct third selection circuit 270 to select the output from first decoder 230 as the input to second decoder 240. Control signal 112b may instruct fourth selection circuit 280 to select the output of second decoder 240 as the output signal 152 to utilization circuitry 150. Accordingly, since in such circumstances second decoder 240 receives decoded data from first decoder 230, second decoder 240 decodes the already decoded data (e.g., using a different decoding scheme) and provides that output to fourth selection circuit 280 for output to utilization circuitry 150.

In some embodiments, second encoder 220 may implement multiple selectable encoding schemes. In such circumstances, control circuitry 110 may provide an additional control signal in control signal 112 to second encoder 220 that instructs second encoder 220 which encoding scheme of the selectable encoding schemes to use to encode data signal 152 received from utilization circuitry 150. In some embodiments, first decoder 230 may implement multiple selectable decoding schemes. In such circumstances, control circuitry 110 may provide an additional control signal in control signal 112 to first decoder 230 that instructs first decoder 230 which decoding scheme of the selectable decoding schemes to use to decode encoded data signal 142 read from storage device 130.

Figure 3:
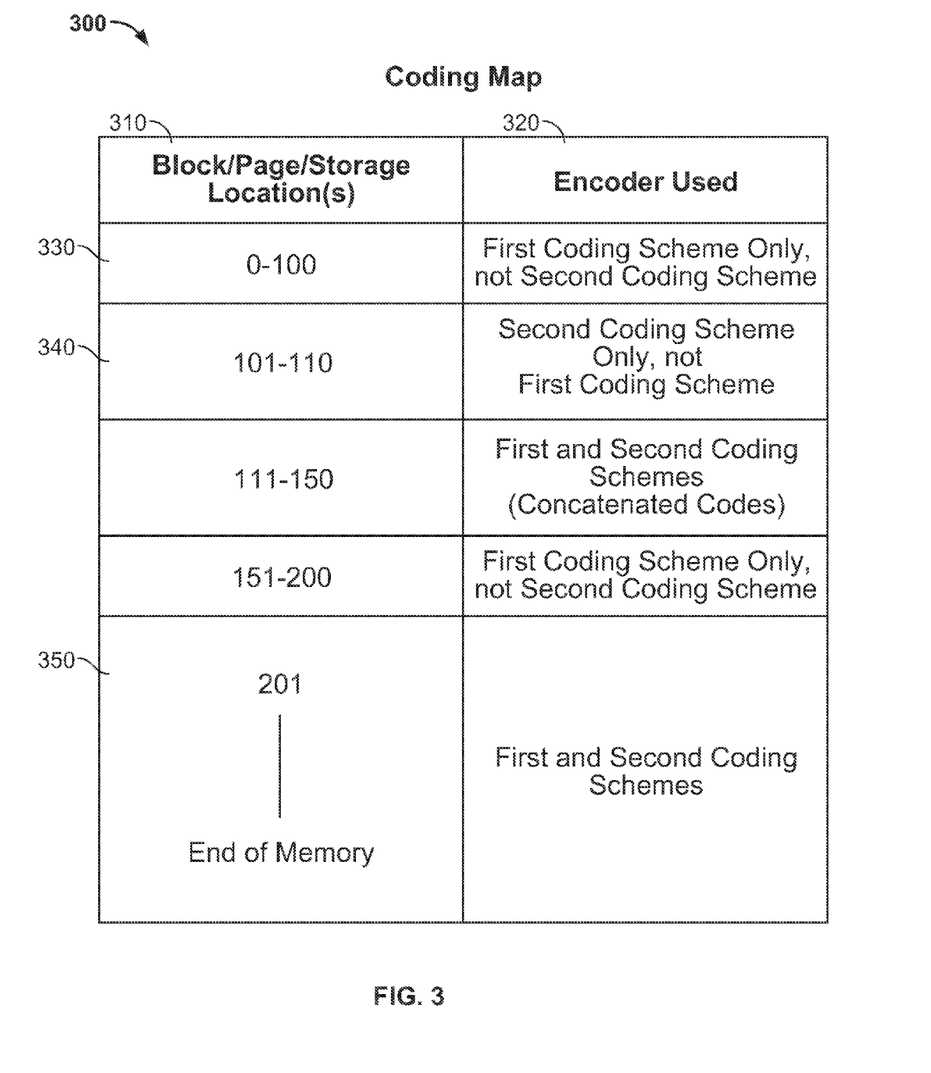
FIG. 3 shows an illustrative coding map in accordance with some embodiments of the present disclosure.

FIG. 3 shows an illustrative coding map 300 in accordance with some embodiments of the present disclosure. Coding map 300 may include a storage location(s) section 310 and an encoding scheme used section 320. Storage location (s) section 310 may identify the block, page, bit or other segment of storage device 130 that corresponds to a particular address. Encoding scheme used section 320 may include information that identifies the life-cycle of the corresponding storage location(s). For example, encoding scheme used section 320 may include the number of program/erase cycles associated with the storage location (s), the age of the storage location(s), the encoding scheme used to encode data in that storage location(s), control signal values for control signals 112*a* and 112*b*, or any other suitable information.

For example, first storage location section 330 may identify or correspond to blocks 0-100 of storage device 130. The life-cycle associated with that section may indicate the encoding scheme used to encode data in those blocks as using a first coding scheme only and not a second coding scheme. Similarly, second storage location section 340 may identify or correspond to blocks 101-110 of storage device 130. The life-cycle associated with that section may indicate the encoding scheme used to encode data in those blocks as using a second coding scheme only and not a first coding scheme. Similarly, third storage location section 350 may identify or correspond to blocks 201 through the last storage location of storage device 130. The life-cycle associated with that section may indicate the encoding scheme used to encode data in those blocks as using a concatenated encoding scheme that combines the first and second coding schemes. Control circuitry 110 may update the data or information stored in coding map 300 as storage device 300 ages and has more program/erase cycles associated with various storage locations.

Figure 4:
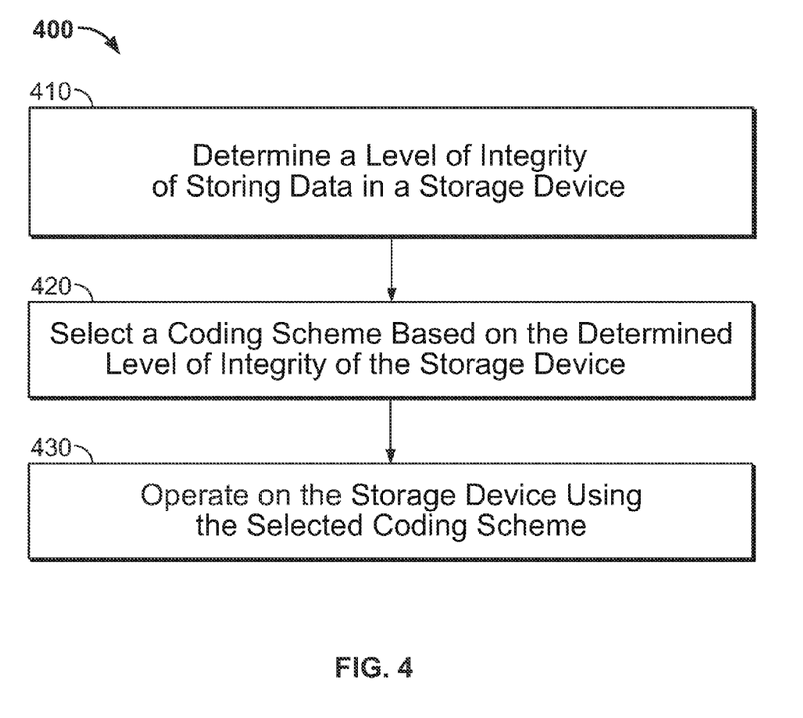
FIG. 4 shows an illustrative flow diagram of a process for operating on a storage device using a life-cycle dependent coding scheme in accordance with some embodiments of the present disclosure.

FIG. 4 shows an illustrative flow diagram 400 of a process for operating a storage device using a life-cycle dependent coding scheme in accordance with some embodiments of the present disclosure. At 410, a level of integrity of storing data in the storage device is determined. For example, control circuitry 110 may compute a life-cycle of storage device 130 based on a number of P/E (program/erase) cycles associated with a storage location of storage device 130.

At 420, a coding scheme is selected based on the determined level of integrity of the storage device. For example, control circuitry 110 may provide a signal representing the life-cycle to adaptive coding circuitry 140 to cause adaptive coding circuitry 140 to select a particular encoding/decoding scheme (e.g., use one or more than one encoders/decoders) to operate (read/write) data to storage device 130. Control circuitry 110 may generate the signal representing the life-cycle by, for example, comparing the life-cycle to one or more thresholds.

At 430, an operation is performed on the storage device using the selected coding scheme. For example, adaptive coding circuitry 140 may encode data received from utilization circuitry 150 for storage in storage device 130 using the selected coding scheme (e.g., only a first encoder, only a second encoder, or a concatenation of both the first and the second encoders) based on the signal representing the life-cycle received from control circuitry 110. Similarly, adaptive coding circuitry 140 may decode data received from storage device 130 for provision to utilization circuitry 150 using the selected coding scheme (e.g., only a first decoder, only a second decoder, or a concatenation of both the first and the second decoders) based on the signal representing the life-cycle received from control circuitry 110.

The foregoing describes systems and methods for adaptively operating on an electronic storage device based on a life-cycle of the electronic storage device. Those skilled in the art will appreciate that the described embodiments of the present disclosure may be practiced by other than the described embodiments, which are presented for the purposes of illustration rather than of limitation.

Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA), both of which may include additional communication circuitry (e.g., radio-frequency circuitry). Alternatively, the present disclosure may also be implemented in software running on any suitable hardware processor. Accordingly, equivalents may be employed and substitutions made, where appropriate, by those skilled in the art herein without departing from the scope of the present disclosure as recited in the claims that follow.

What is claimed is:

1. A method for adaptively operating a storage device, the method comprising:
   determining a level of integrity of storing data in the storage device;
   selecting a coding scheme based on the determined level of integrity of the storage device; and
   operating on the storage device using the selected coding scheme,
   wherein selecting a coding scheme comprises:
   identifying a first coding scheme having a first complexity and a second coding scheme having a second complexity;
   determining whether the level of integrity exceeds a threshold; in response to determining the level of integrity exceeds the threshold, selecting the first coding scheme and the second coding scheme as the selected coding scheme; and
   otherwise, selecting the first coding scheme but not the second coding scheme as the selected coding scheme.

2. The method of claim 1, wherein the level of integrity indicates a number of program-erase cycles associated with the storage device or a number of errors resulting from operating on the storage device.

3. The method of claim 1, wherein the level of integrity indicates a value determined based on a number of errors resulting from an initial operation on the storage device.

4. The method of claim 1, wherein the second complexity is greater than the first complexity.

5. The method of claim 1, wherein the first coding scheme is a BCH coding scheme and the second coding scheme is an Low-Density Parity-Check Code (LDPC) coding scheme.

6. The method of claim 1, wherein operating the storage device comprises:
   encoding the data using the selected coding scheme; and
   writing the encoded data to the storage device.

7. The method of claim 6 further comprising cross-referencing a storage location of the encoded data with an encoding coding scheme associated with the storage location to select the coding scheme.

8. The method of claim 1, wherein operating the storage device comprises:
   reading the data from the storage device; and
   decoding the read data using the selected coding scheme.

9. The method of claim 1, wherein operating the storage device comprises:
  encoding the data using the selected coding scheme;
  writing the encoded data to the storage device;
  reading the data from the storage device; and
  decoding the read data using the selected coding scheme,
  wherein the coding scheme selected for encoding the data includes a combination of a plurality of coding schemes and the coding scheme selected for decoding the data includes a subset of the plurality of coding schemes.

10. A system for adaptively operating a storage device, the system comprising:
  a storage device; and
  control circuitry configured to:
    determine a level of integrity of storing data in the storage device;
    select a coding scheme based on the determined level of integrity of the storage device; and
    operate on the storage device using the selected coding scheme,
  wherein the control circuitry is further configured to:
  identify a first coding scheme having a first complexity and a second coding scheme having a second complexity;
  determine whether the level of integrity exceeds a threshold;
  in response to determining the level of integrity exceeds the threshold, select the first coding scheme and the second coding scheme as the selected coding scheme; and
  otherwise, select the first coding scheme but not the second coding scheme as the selected coding scheme.

11. The system of claim 10, wherein the level of integrity indicates a number of program-erase cycles associated with the storage device or a number of errors resulting from operating on the storage device.

12. The system of claim 10, wherein the level of integrity indicates a value determined based on a number of errors resulting from an initial operation on the storage device.

13. The system of claim 10, wherein the second complexity is greater than the first complexity.

14. The system of claim 10, wherein the first coding scheme is a BCH coding scheme and the second coding scheme is an Low-Density Parity-Check Code (LDPC) coding scheme.

15. The system of claim 10, wherein the control circuitry is further configured to:
  encode the data using the selected coding scheme; and
  write the encoded data to the storage device.

16. The system of claim 15, wherein the control circuitry is further configured to cross-reference a storage location of the encoded data with an encoding coding scheme associated with the storage location to select the coding scheme.

17. The system of claim 10, wherein the control circuitry is further configured to:
  read the data from the storage device; and
  decode the read data using the selected coding scheme.

18. The system of claim 10, wherein the control circuitry is further configured to:
  encode the data using the selected coding scheme;
  write the encoded data to the storage device;
  read the data from the storage device; and
  decode the read data using the selected coding scheme,
  wherein the coding scheme selected for encoding the data includes a combination of a plurality of coding schemes and the coding scheme selected for decoding the data includes a subset of the plurality of coding schemes.

* * * * *